(12) United States Patent
Komoda et al.

(10) Patent No.: US 9,373,495 B2
(45) Date of Patent: Jun. 21, 2016

(54) FLUORINE-CONTAINING RESIN FILM AND SOLAR CELL MODULE

(71) Applicant: DENKI KAGAKU KOGYO KABUSHIKI KAISHA, Tokyo (JP)

(72) Inventors: Fukumu Komoda, Isesaki (JP); Tatsunori Sumino, Isesaki (JP); Koji Nakajima, Isesaki (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 14/357,337

(22) PCT Filed: Oct. 29, 2012

(86) PCT No.: PCT/JP2012/077895
§ 371 (c)(1),
(2) Date: May 9, 2014

(87) PCT Pub. No.: WO2013/069493
PCT Pub. Date: May 16, 2013

(65) Prior Publication Data
US 2014/0305503 A1    Oct. 16, 2014

(30) Foreign Application Priority Data

Nov. 10, 2011    (JP) .................................. 2011-246748

(51) Int. Cl.
| | |
|---|---|
| B32B 27/00 | (2006.01) |
| H01L 21/02 | (2006.01) |
| C08J 5/18 | (2006.01) |
| H01L 31/049 | (2014.01) |

(52) U.S. Cl.
CPC . *H01L 21/02* (2013.01); *C08J 5/18* (2013.01); *H01L 31/049* (2014.12); *C08J 2327/16* (2013.01); *Y02E 10/50* (2013.01)

(58) Field of Classification Search
CPC ..................................................... H01L 3/0487
USPC ........................................................ 524/545
See application file for complete search history.

(56) References Cited

U.S. PATENT DOCUMENTS

| | | | |
|---|---|---|---|
| 8,722,791 B2 * | 5/2014 | Saito et al. ..................... | 524/520 |
| 8,895,140 B2 * | 11/2014 | Yoshimura et al. .......... | 428/328 |
| 2011/0232735 A1 | 9/2011 | Bizet et al. | |
| 2011/0293945 A1 | 12/2011 | Yoshimura et al. | |

FOREIGN PATENT DOCUMENTS

| | | |
|---|---|---|
| CN | 101992572 A | 3/2011 |
| EP | 2 508 563 A1 | 10/2012 |
| EP | 2 703 446 A1 | 3/2014 |
| EP | 2 733 176 A1 | 5/2014 |
| JP | A-1-262133 | 10/1989 |
| JP | A-2006-273980 | 10/2006 |
| JP | 2011-510849 A | 4/2011 |
| WO | 2010/092942 A1 | 8/2010 |
| WO | WO 2011/065234 | 6/2011 |

OTHER PUBLICATIONS

Machine Translation of JP 2006273980.*
International Preliminary Report on Patentability issued in PCT/JP/2012/077895 issued May 13, 2014.
International Search Report issued in PCT/JP2012/077895 mailed Jan. 22, 2013.
Hanada et al., "Polyvinylidene Fluoride and Polyvinyl Acetate, and Crystallization of Polyvinylidene Fluoride in Polyethylmethacrylate Blends," *Journal of Tokyo Kasei Gakuin University*, Jul. 1992, vol. 32, pp. 5-12 (with partial translation).
Jun. 29, 2015 Extended Search Report issued in European Application No. 12847766.8.
Nov. 5, 2015 Office Action issued in Chinese Application No. 201210448275.2.
Apr. 26, 2016 Office Action issued in Japanese Application No. 2013-542929.

* cited by examiner

*Primary Examiner* — Hannah Pak
(74) *Attorney, Agent, or Firm* — Oliff PLC

(57) ABSTRACT

Disclosed is a fluorine-containing resin film which is formed from a fluorine-containing resin composition and has a thickness of 10 to 50 μm, wherein the fluorine-containing resin composition is prepared by adding 10 to 30 parts by mass of titanium oxide or a composite-oxide-type inorganic pigment to 100 parts by mass of a resin component comprising 60 to 95 parts by mass of a vinylidene fluoride resin and 5 to 40 parts by mass of a methacrylic acid ester resin, and wherein the peak intensity ratio of a II-type crystal, which is expressed by (A)/((A)+(B))×100 wherein A represents the peak height at 840 $cm^{-1}$ and B represents the peak height at 765 $cm^{-1}$ in a measurement chart produced by an infrared absorption spectrum, is 60% or more and the total crystallinity is 30% or more as calculated from an X-ray diffraction profile.

9 Claims, No Drawings

FLUORINE-CONTAINING RESIN FILM AND SOLAR CELL MODULE

TECHNICAL FIELD

The present invention relates to a fluorine-containing resin film, a manufacturing method thereof, a backing sheet for a solar cell module formed using said fluorine-containing resin film, and a solar cell module comprising said backing sheet.

BACKGROUND ART

Vinylidene fluoride-based resins have been widely used in fields requiring long-term durability in order to take advantage of their exceptional weather resistance, heat resistance, contamination resistance, chemical resistance, solvent resistance, mechanical properties and secondary workability. In particular, films consisting of vinylidene fluoride resins are often used as solar cell backing sheets to take advantage of their cost when formed into thin films.

However, the demands on long-term reliability for solar cell backing sheet applications have become stricter, requiring use under severe conditions or longer life. In order to achieve such longer life, a method of adding a UV absorbing agent to a specific layer in a multi-layer structured film has been proposed (Patent Document 1). However, even with such a film, the film can be discolored when exposed to a hot and humid environment for a long period of time. This discoloration signifies the creation of double bonds due to a defluorination reaction in the vinylidene fluoride-based resin, which degrades the appearance and reduces the long-term resistance and long-term reliability.

Therefore, as a method of suppressing film discoloration occurring as a result of prolonged exposure to hot and humid environments as mentioned above, film and sheet materials using highly fluorinated resins typified by tetrafluoroethylene resins have been proposed. However, they cannot be considered to be necessarily suitable for use in solar cell backing sheets due to problems in cost, secondary workability and the like. Patent Document 1: JP H1-262133 A

SUMMARY OF THE INVENTION

The present invention was made in view of the above circumstances, and has the purpose of offering a fluorine-containing resin film that is suitable for use as a film for solar cell backing sheets, excelling in weather resistance and size stability, with particularly little discoloration in hot and humid environments.

Additionally, the present invention has the purpose of offering a method for producing the above-mentioned fluorine-containing resin film, a backing sheet formed using the above-mentioned fluorine-containing resin film and a solar cell module comprising said backing sheet.

As a result of diligent research into solving the above-described problems, the present inventors discovered that the problems can be solved by controlling the crystal components of a vinylidene fluoride-based resin in a resin composition by adjusting the amount of components of specific crystal systems, in addition to controlling the degree of crystallinity to within a standard range, thereby resulting in the present invention.

Therefore, according to one embodiment, the present invention offers a fluorine-containing resin film of thickness 10 to 50 μm, formed from a fluorine-containing resin composition obtained by adding 10 to 30 parts by mass of a titanium oxide or composite oxide-containing inorganic pigment with respect to 100 parts by mass in total of resin components consisting of 60 to 95 parts by mass of a vinylidene fluoride-based resin and 5 to 40 parts by mass of a methacrylic acid ester-based resin, the fluorine-containing resin film having a II-type crystal peak intensity ratio, represented by $(A)/((A)+(B)) \times 100$ where (A) is the peak height at $840\ cm^{-1}$ and (B) is the peak height at $765\ cm^{-1}$ in a measuring chart using an infrared absorption spectrum, of at least 60%; and an overall degree of crystallinity of at least 30% as calculated from an X-ray diffraction profile.

According to another embodiment, the present invention offers a method for producing the above-described fluorine-containing resin film, wherein a melted resin consisting of the fluorine-containing resin composition is melt extrusion formed using a T-die process. In this case, a converted heat quantity per unit time when cooling the melted resin is preferably 70 to 180 KW per kg of melted resin according to the equation represented by Formula 1:

$$\text{converted heat quantity} = \text{specific heat of resin composition } (J/kg \cdot {}^\circ C.) \times \Delta T/\text{cooling time (sec)} \quad \text{Formula 1}$$

where ΔT=melted resin temperature−temperature after cooling.

For example, when a resin composition of the present invention is melted at 230° C., the converted heat quantity per kg of melted resin when cooled to 60° C. in 2 seconds is 94 KW. If the converted heat quantity is less than 70 KW, there is a risk of the releasability from the cooling rollers being reduced due to insufficient cooling, and if it exceeds 180 KW, a fluorine-containing resin film having the crystal structure of the present invention cannot be obtained.

In yet further embodiments, the present invention offers a backing sheet for a solar cell module formed by the above-described fluorine-containing resin film and a solar cell module formed using the backing sheet for a solar cell.

The fluorine-containing resin film of the present invention is a film that excels in weather resistance and size stability, and has especially little discoloration in hot and humid environments, suitable for use as a backing sheet for solar cell modules, and enabling a solar cell module using it to be obtained.

MODES FOR CARRYING OUT THE INVENTION

Herebelow, embodiments of the present invention will be explained in more detail.

The fluorine-containing resin film according to a first embodiment of the present invention is formed from a fluorine-containing resin composition obtained by adding a predetermined amount of titanium oxide or a composite oxide-containing inorganic pigment to a resin component consisting of a vinylidene fluoride-based resin and a methacrylic acid ester-based resin.

Vinylidene fluoride-based resins in this case refer to homopolymers of vinylidene fluoride or copolymers of vinylidene fluoride and monomers copolymerizable therewith. Examples of copolymers include vinylidene fluoride-tetrafluoroethylene-hexafluoropropylene copolymers and vinylidene fluoride-hexafluoropropylene copolymers. However, vinylidene fluoride homopolymers are most preferably used for the ease of controlling their crystal structure.

Methacrylic acid ester-based resins excel in compatibility with vinylidene fluoride-based resins, improve the workability by lowering the extrusion temperature during film extrusion forming, and improve the adhesiveness during lamination with other materials. In this case, methacrylic acid ester-based resins refer to homopolymers of methacrylic acid esters such as methyl methacrylate or copolymers of methacrylic acid esters such as methyl methacrylate with monomers copolymerizable therewith. Examples of copolymerizable monomers include methacrylic acid esters having 2 to 4 carbon atoms, acrylic acid esters having 1 to 8 carbon atoms such as methyl acrylate and butyl acrylate, styrene, α-methylstyrene, acrylonitrile, acrylic acid, and other ethylene-based unsaturated monomers. Preferred is a copolymer of methyl methacrylate and an acrylic acid ester having 1 to 8 carbon atoms, and more preferred is a methyl methacrylate copolymer having butyl acrylate or methyl acrylate as comonomers.

The titanium oxide or composite oxide-containing inorganic pigment is added primarily to provide the film with shielding ability and a UV shielding effect. Examples of composite oxide-containing inorganic pigments in this case include titanium yellows with rutile-type or priderite-type crystals mainly composed of $TiO_2.Sb_2O_3.BaO.NiOCr_2O_3$, zinc-iron browns with spinel-type crystals mainly composed of $ZnO.Fe_2O_3.Cr_2O_3$, cobalt blues with spinel-type crystals mainly composed of $CoO.Al_2O_3.Cr_2O_3$, greens mainly composed of $TiO_2.CoO.NiO.ZnO$, spinel-type blacks composed of $CuO.Cr_2O_3$ or $CuO.Fe_2O_3.Mn_2O_3$, and violets consisting of $CoO$ or $Mn_2O_3$.

In one embodiment of the present invention, the above-described resin composition is formed by adding 10 to 30 parts by mass of titanium oxide or a composite oxide-containing inorganic pigment with respect to 100 parts by mass total of resin components consisting of 60 to 95 parts by mass of a vinylidene fluoride-based resin and 5 to 40 parts by mass of a methacrylic acid ester-based resin. A fluorine-containing resin film is produced by melt extrusion forming a resin composition obtained by blending these components in the amounts in the ranges indicated, to produce a fluorine-containing resin film. By controlling the production conditions, a film excelling in size stability in addition to weather resistance due to a certain crystal structure, with little discoloration even in hot and humid environments, is obtained.

The film according to an embodiment of the present invention is primarily characterized in that the crystal form of the vinylidene fluoride-based resin has a component ratio between I-type crystal (β crystal) structures and II-type crystal (α crystal) structures determined by absorbance in the infrared absorption spectrum such that the peak intensity ratio of the II-type crystal is at least 60%, preferably 60 to 100%, and more preferably 80 to 100%, and the degree of crystallinity is at least 30%. If the II-type crystal peak intensity is less than 60%, the effect of suppressing the occurrence of double bonds due to a defluorination reaction is small, so there is a risk of increased discoloration of the film. Additionally, if the degree of crystallinity is less than 30%, the discoloration of the film can increase due to a similar phenomenon.

In this case, the method for measuring the II-type crystal peak intensity ratio is to perform the following calculations based on the method of Hanada et al. (Tomomi Hanada and Yutaka Ando, "Polyvinylidene fluoride, polyvinyl acetate and crystallinity of polyvinylidene fluoride in polymethylmethacrylate blend systems", *Journal of Tokyo Kasei Gakuin University*, July 1992, No. 32, pp. 5-12). In the infrared absorption spectrum, absorption of I-type crystals of polyvinylidene fluoride resin occurs at a wavenumber of 840 $cm^{-1}$, and absorption of II-type crystals occurs at a wavenumber of 765 $cm^{-1}$, so the component ratio (%) of II-type crystals is represented by ((absorption at 765 $cm^{-1}$)/(absorption at 765 $cm^{-1}$+absorption at 840 $cm^{-1}$))×100(%). Therefore, the peak intensity ratio of the II-type crystals is represented by (A)/((A)+(B))×100 where (A) is the peak height at 840 $cm^{-1}$ and (B) is the peak height at 765 $cm^{-1}$ in a measuring chart using the infrared absorption spectrum, and in a preferable embodiment of the present invention, a film is formed so as to make this value at least 60%, preferably 60 to 100%, and more preferably 80 to 100%. While the resin components in the present embodiment are not the same as the resin components in the method of Hanada et al., there is no difference in the absorption properties of the crystals in the infrared absorption spectrum, so the above relationship can be directly applied to the composition system in the present embodiment.

Additionally, the degree of crystallinity was calculated from the X-ray diffraction profile, specifically, for example, as described in the examples. In the film according to the present embodiment, the degree of crystallinity must be at least 30%.

The resin film of the present invention may be blended with other optional additive components within a range that does not detract from the effects of the present invention, particularly within a range that satisfies the above-described crystal structure properties. For example, it is possible to add pigments other than the specific pigments named above, fillers, UV absorbing agents, stabilizing agents, dispersing agents, anti-oxidants, anti-gloss agents, surface active agents, anti-static agents, fluorine-containing surface modifiers and processing aids.

The fluorine-containing resin film according to the present embodiment may be produced by any method as long as the above-mentioned properties can be achieved, but for convenience, they may be produced by melt extrusion forming as conventionally used. More specifically, there are T-die methods for producing films using T-shaped dice and methods of forming films using inflation dice, but the extrusion conditions are not particularly restricted, and any commonly used conditions for forming vinylidene fluoride-based resin films may be used. In the T-die method, a metallic cooling roller and a rubber roller are disposed underneath T-shaped dice, and a melted resin extruded from the lips of the T-shaped dice is cooled and solidified by pinching between the rollers to form a film. Alternatively, the pinch rollers may not be used and the film formed by cooling and solidifying with only the metallic cooling rollers. In either case, the converted heat quantity per unit time when cooling the melted resin should preferably be 70 to 180 kW per kg of melted resin according to the equation represented by Formula 1:

converted heat quantity=specific heat of resin composition (J/kg·° C.)×ΔT/cooling time (sec)  Formula 1 where ΔT=melted resin temperature−temperature after cooling.

For example, when the resin composition of the present invention is melted at 230° C., the converted heat quantity per kg of the melted resin when cooling to 60° C. in 2 seconds is 94 KW. If the converted heat quantity is less than 70 KW, there is a risk of reduced releasability from the cooling roller due to insufficient cooling, and at more than 180 KW, a fluorine-containing resin film having the crystal structure of the present invention cannot be obtained. The extrusion formed film preferably has a thickness of 10 to 50 μm in a cooled and solidified state.

The fluorine-containing resin film according to the embodiments of the present invention has excellent weather resistance, heat resistance, contamination resistance, chemical resistance, solvent resistance, mechanical properties and secondary workability, so it can be used in various fields requiring long-term durability, but in one embodiment, it is attached directly or by lamination with other resin layers to the rear surface of a solar cell module as a backing sheet for the solar cell module.

EXAMPLES

Herebelow, the present invention will be explained in further detail by giving examples, but the present invention need not be limited thereto. The methods for evaluation of the respective physical properties are as follows.

(1) α Crystal Peak Intensity Ratio (Component Proportion (%) of II-type Crystal)

For the α crystal peak intensity, the infrared absorption spectrum was measured using an ATR unit (UMA-t00) of a Bio-Rad FT-IR (body: FTS-135). From the resulting spectrum, the absorption intensity at a wavenumber of 840 cm$^{-1}$ which is the characteristic absorption of β-type crystal (peak height (A)) and the absorption intensity at a wavenumber of 760 cm$^{-1}$ which is the characteristic absorption of α-type crystal (peak height (B)) were determined, and the component proportion (%) of the α-type crystal was calculated from the following formula.

$$(A)/((A)+(B))\times 100(\%)$$

(2) Degree of Crystallinity (%)

The degree of crystallinity was measured using a high-power X-ray diffraction device (MAC Science MXP-18). When making the measurements, the long side of the sample was aligned with the lateral direction of the sample plate (direction of incidence of X-rays/detector). The data analysis was performed by separating peaks from the PVDF crystal structure within the range of 2θ=10°–30° using the profile fitting function of XRD data analysis software (JADE ver. 6), and the degree of crystallinity was calculated from the peak heights. The measurement conditions are indicated below.

X-ray Source: Cu rotating counter electrode
Applied Voltage/Current: 50 kV/300 mA
Measurement Range: 5°≤2θ≤40°
Measurement Step: 0.05°
Scanning Rate: 1°/min
Slit Arrangement: DS, SS; 1.0°, RS; 0.3 mm, CS; 0.8 mm (Graphite Monochromator Used)

(3) Degree of Yellowing after Heat/Humidity Testing (ΔYI)

The prepared film was subjected to a damp heat test for 1000 hours using an Espec PR-3KPH at a testing temperature of 85° C.±2° C. and a relative humidity of (85±5)% in accordance with the JIS C8990 standard in order to evaluate the heat and humidity resistance. After the test, the ΔYI (yellow index) value was calculated by performing a color difference measurement using a Nippon Denshoku ZE-2000 Color Meter in accordance with the JIS K7105 standard in order to evaluate the degree of yellowing of the film. As the evaluation standard, yellowing was judged to be low with a ΔYI value of 5 or less.

(4) Hue Change (ΔE) after UV Irradiation Testing

The prepared film was subjected to UV irradiation by a UV irradiation device under conditions of black panel temperature 60° C., UV irradiation intensity (295-435 nm) 100 mw/m$^2$ and testing time 200 hours, then the hue change was evaluated using a Nippon Denshoku ZE-2000 Color Meter in accordance with the JIS K7105 standard in order to find the hue change in the film. As the evaluation standard, a ΔE value of 2 or less was judged to be of a level posing no problems for practical use.

Examples 1-12 And Comparative Examples 1-5

The resin compositions of Examples 1-12 and Comparative Examples 1-5 shown in Table 1 were kneaded by a biaxial extruder of ϕ30 mm to obtain the respective compounds. Next, the compounds were used for T-die film formation using a uniaxial extruder of ϕ40 mm at an extrusion temperature of 250° C. to obtain a film of predetermined thickness. During T-die film formation, the quantity of heat converted when cooling was set to the numerical values shown in Table 1 and Table 2.

As the raw materials blended into the resin compositions, the following were used:
Vinylidene fluoride resin: Kynar K720 (Arkema)
Methacrylic acid ester resin: Hipet IR-404 (Mitsubishi Rayon)
Titanium oxide: Ti-Pure R960 (DuPont)

The prepared films of Examples 1-12 and films of Comparative Examples 1-5 were evaluated as to their α crystal peak intensity ratio (II-type component proportion (%)), degree of crystallinity, degree of yellowing after heat and humidity testing and hue change after UV irradiation testing, in accordance with the evaluation methods described above. The results are shown in Table 1 and Table 2.

TABLE 1

| | Examples | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Vinylidene fluoride resin (mass %) | 65 | 70 | 70 | 70 | 80 | 80 | 80 | 80 | 90 | 80 | 80 | 80 |
| Methacrylic acid ester resin (mass %) | 35 | 30 | 30 | 30 | 20 | 20 | 20 | 20 | 10 | 20 | 20 | 20 |
| Titanium oxide (mass parts) | 15 | 15 | 15 | 20 | 15 | 20 | 20 | 25 | 25 | 25 | 25 | 25 |
| α crystal peak intensity ratio (%) | 75 | 72 | 81 | 77 | 80 | 88 | 93 | 92 | 94 | 95 | 93 | 65 |
| Degree of crystallinity (%) | 37 | 39 | 41 | 38 | 38 | 41 | 42 | 41 | 43 | 44 | 43 | 34 |
| Film thickness (μm) | 20 | 15 | 30 | 20 | 20 | 20 | 20 | 20 | 20 | 15 | 40 | 15 |
| Converted heat quantity when cooling (KW) | | | 91.2 | | | 85.7 | 83.0 | 83.0 | 83.0 | 77.0 | 175.0 | 170.5 |
| Degree of yellowing after heat/humidity testing (ΔYI) | 4.2 | 4.1 | 3.8 | 3.9 | 3.5 | 3.3 | 3.0 | 2.8 | 2.2 | 0.7 | 1.6 | 3.6 |
| Hue change after UV irradiation testing (ΔE) | 1.0 | 0.8 | 0.7 | 0.7 | 0.6 | 0.6 | 0.5 | 0.4 | 0.3 | 0.2 | 0.6 | 1.5 |
| Overall score | ◯ | ◯ | ◯ | ◯ | ◯ | ◯ | ◯ | ◯ | ◯ | ◯ | ◯ | ◯ |

TABLE 2

|  | Comparative Examples | | | | |
| --- | --- | --- | --- | --- | --- |
|  | 1 | 2 | 3 | 4 | 5 |
| Vinylidene fluoride resin (mass %) | 70 | 70 | 50 | 30 | 70 |
| Methacrylic acid ester resin (mass %) | 30 | 30 | 50 | 70 | 30 |
| Titanium oxide (mass parts) | 15 | 15 | 15 | 15 | 5 |
| α crystal peak intensity ratio (%) | 14 | 65 | 30 | 25 | 60 |
| Degree of crystallinity (%) | 34 | 20 | 34 | 31 | 20 |
| Film thickness (μm) | 20 | 15 | 20 | 20 | 20 |
| Converted heat quantity when cooling (KW) | 210.1 | 94.0 | 91.2 | 91.2 | 91.2 |
| Degree of yellowing after heat/humidity testing (ΔYI) | 10.5 | 7.5 | 8.6 | 10.2 | 6.3 |
| Hue change after UV irradiation testing (ΔE) | 0.8 | 0.7 | 1.7 | 5.4 | 1.5 |
| Overall score | x | x | x | x | x |

As can be seen from these results, the films of Examples 1-12 of the present invention cleared all evaluated categories and exhibited favorable results, while the films of Comparative Examples 1-5 had a high degree of yellowing after heat and humidity testing or underwent large hue changes after UV irradiation testing.

The invention claimed is:

1. A fluorine-containing resin film of thickness 10 to 50 μm, formed from a fluorine-containing resin composition obtained by adding 10 to 30 parts by mass of a titanium oxide or composite oxide-containing inorganic pigment with respect to 100 parts by mass in total of resin components consisting of 60 to 95 parts by mass of a vinylidene fluoride-based resin and 5 to 40 parts by mass of a methacrylic acid ester-based resin, the fluorine-containing resin film having a II-type crystal peak intensity ratio, represented by $(A)/((A)+(B)) \times 100$ where (A) is the peak height at 840 $cm^{-1}$ and (B) is the peak height at 765 $cm^{-1}$ in a measuring chart using an infrared absorption spectrum, of at least 60%; and an overall degree of crystallinity of at least 30% as calculated from an X-ray diffraction profile, wherein a melted resin consisting of the fluorine-containing resin composition is melt extrusion formed using a T-die process, thereby forming the fluorine-containing resin film and a converted heat quantity per unit time when cooling the melted resin is 70 to 180 kW per kg of melted resin according to the equation represented by Formula 1:

converted heat quantity=specific heat of resin composition (J/kg–C)×*ΔT*/cooling time (sec)　　　Formula 1 wherein ΔT=melted resin temperature−temperature after cooling.

2. A backing sheet adapted for a solar cell module and comprising the fluorine-containing resin film according to claim 1.

3. A solar cell module comprising the backing sheet for the solar cell module according to claim 2.

4. The fluorine-containing resin film according to claim 1, wherein the vinylidene fluoride-based resin is a vinylidene fluoride homopolymer.

5. The fluorine-containing resin film according to claim 1, wherein the methacrylic acid ester-based resin is a copolymer of methyl methacrylate and an acrylic acid ester having 1 to 8 carbon atoms.

6. The fluorine-containing resin film according to claim 5, wherein the acrylic acid ester is butyl acrylate or methyl acrylate.

7. The fluorine-containing resin film according to claim 1, wherein the II-type crystal peak intensity ratio is at least 80%.

8. The fluorine-containing resin film according to claim 1, wherein the fluorine-containing resin film has a degree of yellowing after heat/humidity testing (AYI) according to JIS K7105 Standard of 5 or less.

9. The fluorine-containing resin film according to claim 1, wherein the fluorine-containing resin film has a hue change (AE) after UV irradiation testing according to JIS K7105 Standard of 2 or less.

* * * * *